US009730196B2

(12) United States Patent
Hamzeh et al.

(10) Patent No.: US 9,730,196 B2
(45) Date of Patent: Aug. 8, 2017

(54) LTE CONTROL CHANNEL RESERVATION IN RF BANDS WITH COMPETING COMMUNICATION SYSTEMS

(71) Applicant: Cable Television Laboratories, Inc., Louisville, CO (US)

(72) Inventors: Belal Hamzeh, Westminster, CO (US); Jennifer Andreoli-Fang, Boulder, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 143 days.

(21) Appl. No.: 14/510,814

(22) Filed: Oct. 9, 2014

(65) Prior Publication Data
US 2016/0037501 A1 Feb. 4, 2016

Related U.S. Application Data

(60) Provisional application No. 62/030,443, filed on Jul. 29, 2014.

(51) Int. Cl.
| | |
|---|---|
| *H04W 72/04* | (2009.01) |
| *H03M 13/35* | (2006.01) |
| *H04L 1/00* | (2006.01) |
| *H04J 3/06* | (2006.01) |
| *H04J 3/16* | (2006.01) |
| *H04L 5/00* | (2006.01) |
| *H04W 72/08* | (2009.01) |
| *H04W 84/12* | (2009.01) |

(52) U.S. Cl.
CPC ..... *H04W 72/0406* (2013.01); *H03M 13/353* (2013.01); *H04J 3/0647* (2013.01); *H04J 3/1694* (2013.01); *H04L 1/0009* (2013.01); *H04L 1/0041* (2013.01); *H04L 5/0092* (2013.01); *H04W 72/0446* (2013.01); *H04W 72/082* (2013.01); *H04W 84/12* (2013.01)

(58) Field of Classification Search
None
See application file for complete search history.

(56) References Cited

U.S. PATENT DOCUMENTS

| | | | |
|---|---|---|---|
| 5,828,677 A | 10/1998 | Sayeed et al. | |
| 2008/0187059 A1 | 8/2008 | Sood | |
| 2008/0317162 A1* | 12/2008 | Roh | H04L 1/189 375/295 |
| 2011/0246862 A1 | 10/2011 | Graef | |
| 2012/0164948 A1 | 6/2012 | Narasimha et al. | |

(Continued)

*Primary Examiner* — Rhonda Murphy
(74) *Attorney, Agent, or Firm* — Duft Bornsen & Fettig LLP; Gregory T. Fettig

(57) ABSTRACT

Systems and methods presented herein provide for an LTE wireless communication system operating in an RF band with a conflicting wireless system. The LTE system includes a first eNodeB operable to transmit downlink communications to UEs in the RF band and to receive uplink communications from the UEs in the RF band. The first eNodeB is also operable to transmit an LTE control channel across a portion of the RF band, to time divide the LTE control channel into a plurality of subchannels, and to occupy a first of the subchannels. A second eNodeB is operable to detect the LTE control channel and to occupy a second of the subchannels proximate in time to the first subchannel of the first eNodeB.

9 Claims, 5 Drawing Sheets

(56) References Cited

U.S. PATENT DOCUMENTS

| | | |
|---|---|---|
| 2012/0213116 A1 | 8/2012 | Koo et al. |
| 2013/0028201 A1 | 1/2013 | Koo et al. |
| 2013/0148638 A1* | 6/2013 | Xing ................ H04W 72/0446 370/336 |
| 2013/0208587 A1 | 8/2013 | Bala et al. |
| 2013/0272260 A1 | 10/2013 | Bitran et al. |
| 2014/0161021 A1 | 6/2014 | Goldhamer |
| 2015/0085683 A1 | 3/2015 | Sadek et al. |
| 2015/0163767 A1 | 6/2015 | Shaw et al. |
| 2015/0245365 A1 | 8/2015 | Isokangas et al. |

\* cited by examiner

LTE CONTROL CHANNEL RESERVATION IN RF BANDS WITH COMPETING COMMUNICATION SYSTEMS

CROSS REFERENCE TO RELATED APPLICATIONS

This patent application claims priority to, and thus the benefit of an earlier filing date from, U.S. Provisional Patent Application No. 62/030,443 (filed Jul. 29, 2014), the entire contents of which are hereby incorporated by reference.

BACKGROUND

Long Term Evolution (LTE) wireless communications presently operate in certain licensed bands of the Radio Frequency (RF) spectrum so as to avoid conflicts with other wireless communication systems. However, LTE can operate in virtually any portion of the RF spectrum, including certain unlicensed portions of the spectrum where WiFi communication systems operate. Due to the nature of its MAC and PHY layers, LTE poses challenges to coexistence with other radio access technologies, such as WiFi. For example, WiFi is designed to coexist with other technologies via channel sensing and random backoff. But, LTE downlink channels are designed to continuously operate at a predefined power level decided by the operator's coverage requirements, regardless of where user equipment (UE) being served is actually located. Any LTE system operating in the same band as a WiFi system would interfere with the WiFi system because the WiFi system would have little chance to sense a clear channel and deem it suitable for transmission.

SUMMARY

Systems and methods presented herein provide for an LTE wireless communication system operating in an RF band with a conflicting wireless system, such as a WiFi system. The LTE system includes a first eNodeB operable to transmit downlink communications to UEs in the RF band and to receive uplink communications from the UEs in the RF band. The first eNodeB is also operable to transmit an LTE control channel across a portion of the RF band, to time divide the LTE control channel into a plurality of subchannels, and to occupy a first of the subchannels. The LTE system also includes a second eNodeB operable to transmit downlink communications to the UEs in the RF band and to receive uplink communications from the UEs in the RF band. The second eNodeB is further operable to detect the LTE control channel and to occupy a second of the subchannels proximate in time to the first subchannel of the first eNodeB.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

Figure 1:
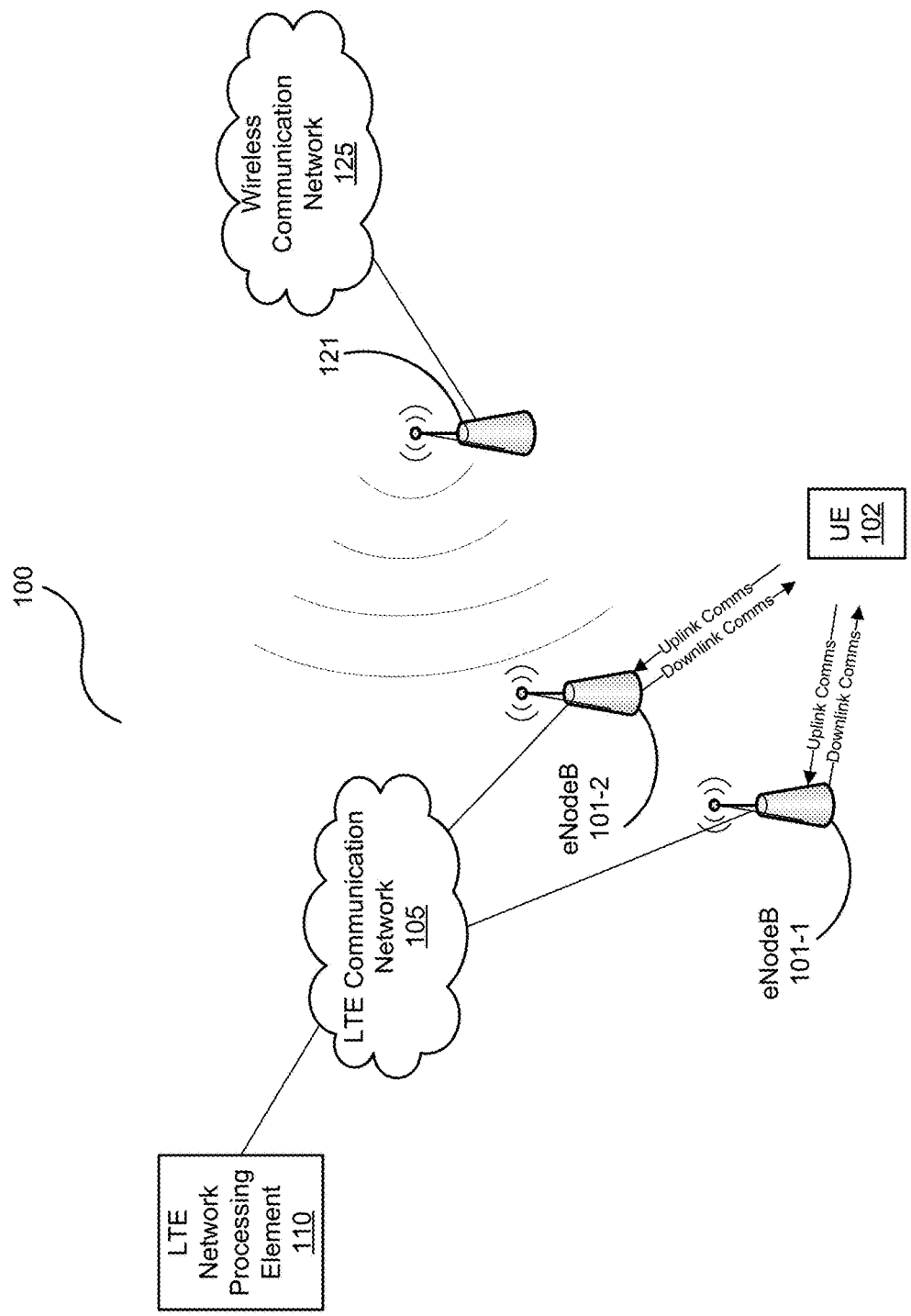
FIG. 1 is a block diagram of an exemplary LTE wireless telecommunication system operable to coexist with other communication systems.

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

In LTE, a Physical Downlink Control Channel (PDCCH) carries downlink allocation information and uplink allocation grants for a terminal. And, a Downlink Shared Channel (DL-SCH) carries Primary Synchronization Signals (PSS) and Secondary Synchronization Signals (SSS) for the UEs to discover an LTE cell. The DL-SCH elements are generally configured at the center of a channel and a Master Information Block (MIB) is transmitted therefrom. For example, in order to communicate with a network, a UE obtains basic system information, which is carried by the MIB (static) and a System Information Block (dynamic; "SIB"). The MIB carries the system information including system bandwidth, System Frame Number (SFN), and a Physical Hybrid Automatic Repeat Request (PHARQ) Indicator Channel Configuration, or PHICH.

The MIB is carried on a Broadcast Channel (BCH) and mapped into a Physical Broadcast Channel (PBCH), which is transmitted with a fixed coding and modulation scheme that can be decoded after an initial cell search procedure. With the information obtained from the MIB, UEs can decode a Control Format Indicator (CFI), which indicates the PDCCH length and allows the PDCCH to be decoded. The presence, in the PDCCH, of a Downlink Control Information (DCI) message scrambled with System Information Radio Network Temporary Identifier (SI-RNTI) indicates that an SIB is carried in the same subframe.

The SIB is transmitted in the Broadcast Control Channel (BCCH) logical channel and BCCH messages are generally carried and transmitted on the DL-SCH. Control signaling is used to support the transmission of the DL-SCH. Control information for UEs is generally contained in a DCI message transmitted through the PDCCH. The number of MNOs (again, "Mobile Network Operators"), the allocation percentage per MNO, and the expected variation in allocation generally determine optimal locations for the center of each DL-SCH, thereby limiting the probability of DL-SCH relocations.

When employing TDD in an LTE network, time coordination is used between the eNodeBs in the LTE network, including coarse time coordination, fine time coordination, and synchronized time coordination. Coarse time coordination means that at least two eNodeBs share a clock with resolution greater than a clock pulse. Fine time coordination indicates that at least two eNodeBs share a clock with resolution less than the length of a cyclic prefix. Synchronized time coordination means that sample clocks are locked between the two eNodeBs.

When employing FDD in an LTE network, frequency coordination is used to between the eNodeBs in the LTE network. Generally, frequency coordination and allocation is semi-static, real time, and/or dynamic. Semi-static spectrum allocation means that spectrum allocation is provisioned by MNO agreements and changes infrequently. Real-time spectrum allocation means that spectrum allocation between MNOs that can vary dynamically based on resource needs and scheduler capability. Allocations are flexible within bounds that are configured by agreement between MNOs. Dynamic scheduling means channel time allocations that are variably sized for each MNO.

Generally, in LTE DLs, two synchronization signals are transmitted in six center Resource Blocks (RBs), including a Primary Sync Signal (PSS) and a Secondary Synchronization Signal (SSS). Information about system bandwidth is contained in the MIB and is expressed as some number of kHz above or below the center frequency. When a UE initially comes online, it finds the PSS/SSS and then the MIB.

Turning now to FIG. 1, an exemplary LTE wireless telecommunication system 100 is illustrated. In this embodiment, the LTE system 100 is operable to alter communication strategies to avoid interference with other conflicting wireless communication systems, such as wireless communication network 125 and the wireless transceiver 121, operating in the same RF band as the LTE system 100. One example of a conflicting wireless communication system operating in the same RF band as the LTE system 100 includes a WiFi network. Although shown with two base stations, or "eNodeBs", 101-1 and 101-2 (i.e., for the sake of simplicity), the LTE system 100 typically comprises a plurality of eNodeBs 101 that are operable to transmit to a plurality of subscriber UEs 102 through downlink communications and to receive uplink communications from the UEs 102. The uplink and downlink communications can be processed in a variety of ways as a matter design choice (e.g., at the eNodeB 101, back office processing of a Mobile Communications Operator—"MCO", Virtual Radio Access Networks—"VRANs", etc.). Accordingly, the base station 101 may be implemented based on the type of uplink and downlink communication processing being employed (e.g., VRANs use base stations that are for the most part antennas and transceivers that do not perform call processing).

In whatever form, an LTE network processing element 110, being part of the LTE communication network 105, alters its communications so as to avoid interference from another communication system operating in the same RF band. More particularly, the LTE network processing element 110 changes the manner in which the control channel is transmitted from the eNodeBs 101. Thus, the LTE network processing element 110 is any system, device, software, or combination thereof operable to change control channel signaling of the eNodeBs 101 to avoid interference from other wireless systems. Examples of the UE 102 include cell phones, table computers, laptop computers, and the like. The LTE system 100 of FIG. 1 will now be shown and described with respect to one exemplary process in FIG. 2.

Figure 2:
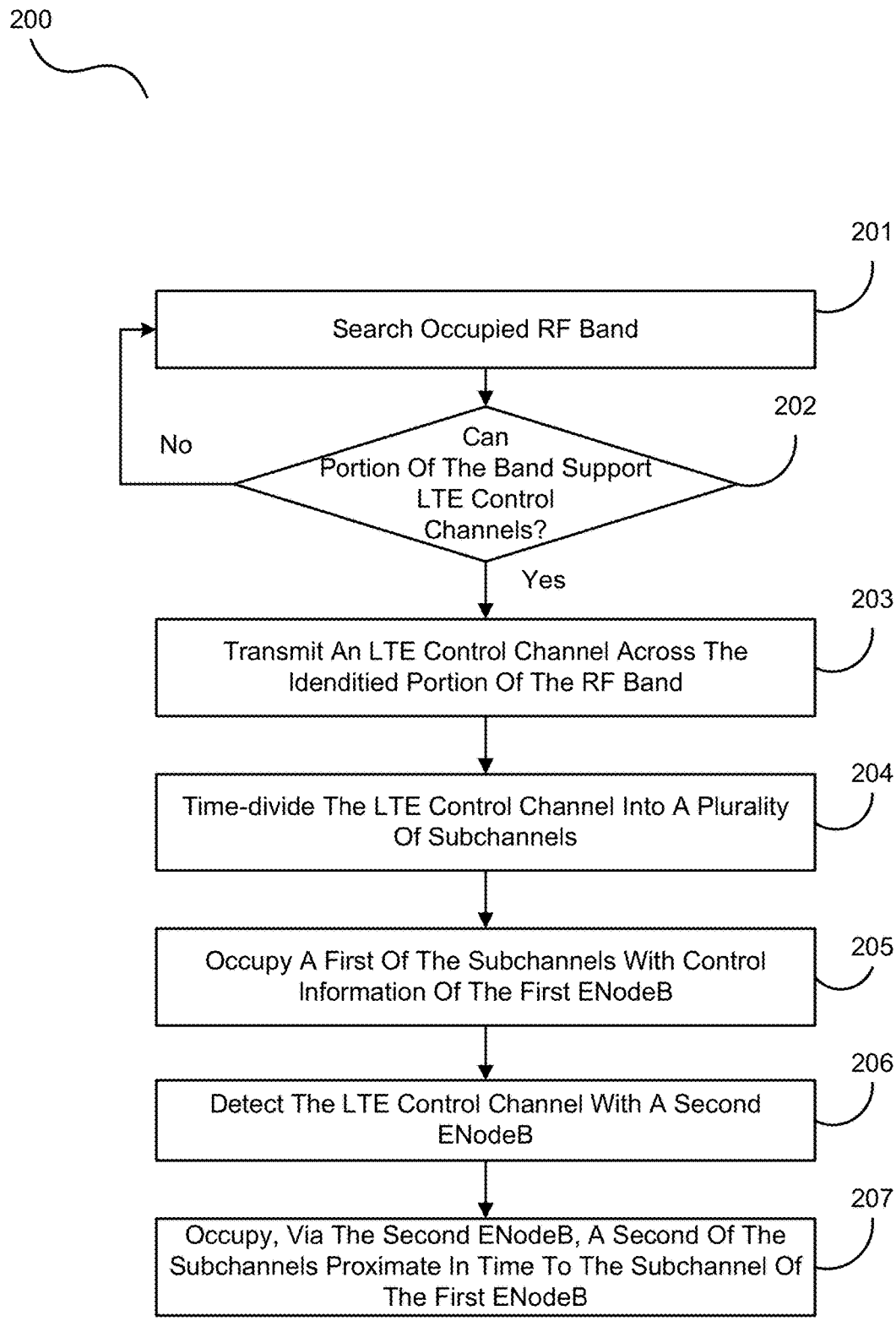
FIG. 2 is a flowchart illustrating an exemplary process of the LTE wireless telecommunication system.
Figure 3:
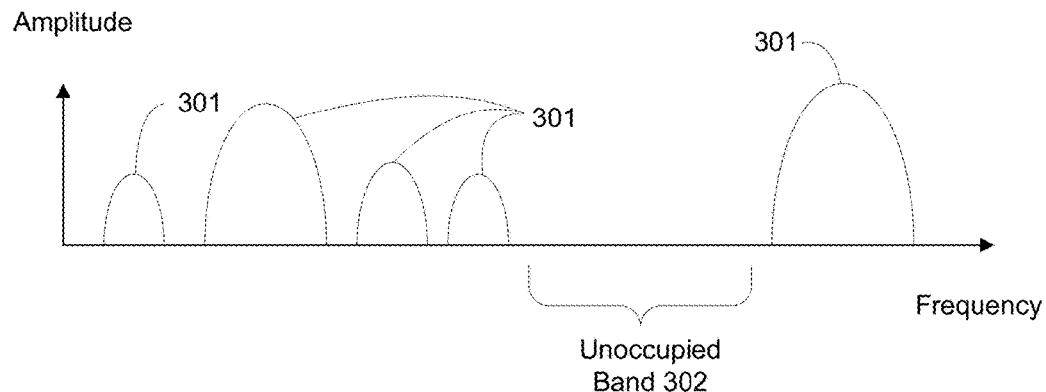
FIG. 3 is a graph of an exemplary RF band in which the LTE wireless telecommunications system operates.

FIG. 2 is a flowchart illustrating an exemplary process 200 of the LTE wireless telecommunication system 100 of FIG. 1. For the purposes of illustration, the eNodeB 101-1 prepares to establish LTE communications with the UE 102 in an RF band occupied by one or more wireless systems that have the potential to interfere with those communications. In doing so, the eNodeB 101-1 establishes an LTE control channel. Since the RF band is occupied with other wireless systems, the eNodeB 101-1 searches the RF band, in the process element 201, to determine whether a portion of the RF band can support LTE control channels, in the process element 202. For example, in FIG. 3, a graph illustrates the amplitude versus frequency spectrum of an RF band with multiple forms of RF energy 301 residing therein (e.g., communication signals, WiFi signaling, noise, etc.). The eNodeB 101-1 scans the RF spectrum and identifies the unoccupied portion of the band 302 where the least amount of interference may occur due to the lack of RF energy in the band.

Figure 4:
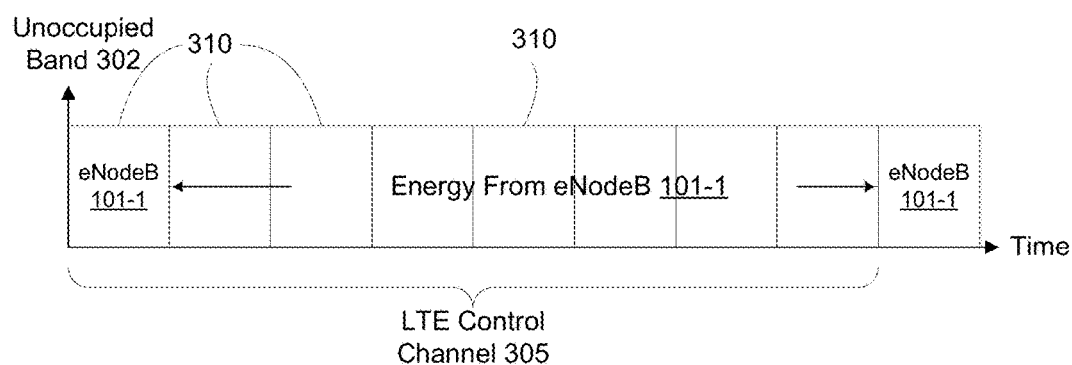
FIGS. 4-7 are graphs illustrating exemplary control channels of the LTE wireless telecommunications system.

Once a portion of the RF band that can support the LTE control channels has been identified, the eNodeB 101-1 transmits an LTE control channel across that portion of the RF band, the process element 203. The eNodeB 101-1 thus reserves that portion of the RF band for its control channel signaling and for the control channel signaling of other eNodeBs 101. For example, in FIG. 4, the graph illustrates the eNodeB 101-1 radiating energy across the unoccupied portion of the band versus time. The control channel of the eNodeB 101-1 repetitively occupies a certain duration as illustrated by the LTE control channel 305 in the graph.

Figure 5:
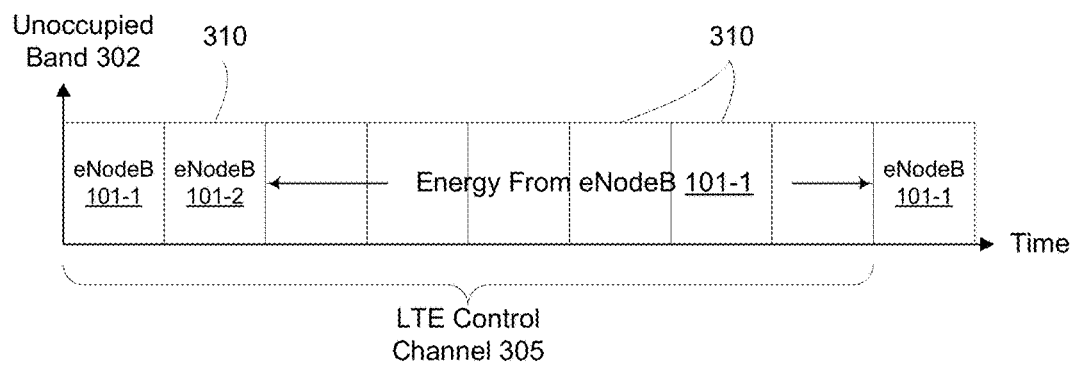

The eNodeB 101 time divides the control channel 305, in the process element 204, into a plurality of "sub channels" 310 that can be occupied by other eNodeBs 101 searching the unoccupied portion of the RF band to transmit control channel information. For example, in FIG. 4, the eNodeB 101-1 occupies a first sub channel 310 with its control information, in the process element 205. Then, with the LTE control channel 305 established, the second eNodeB 101-2 may search to establish its control channel information. In doing so, the eNodeB 101-2 may detect the LTE control channel established by the eNodeB 101-1, in the process element 206. Thereafter, the eNodeB 101-2 may occupy a second of the sub channels 310, in the process element 207, as illustrated in FIG. 5.

To assist in synchronization and general LTE control channel 305 reservation, the eNodeB 101-2 may occupy the sub channel 310 proximate in time to the sub channel 310 of the eNodeB 101-1. For example, if the eNodeB 101-1 establishes the LTE control channel 305 and occupies only its sub channel 310, another wireless communication system may search that portion of the RF band at a particular time when the eNodeB 101-1 is not transmitting its control information and as well determine that the RF band is unoccupied. Thus, the other wireless system may determine that it can initiate communications which would interfere with the communications of eNodeB 101-1. So, to transmit its control information, the eNodeB 101-1 generally needs to reserve and maintain that unoccupied portion of the RF spectrum. And, upon occupying its sub channel 310, eNodeB 101-1 fills the remaining portion of the LTE channel 305 with other forms of RF energy (e.g., via random or deterministic patterns) to prevent other wireless communications from occupying that portion of the RF band.

Figure 6:
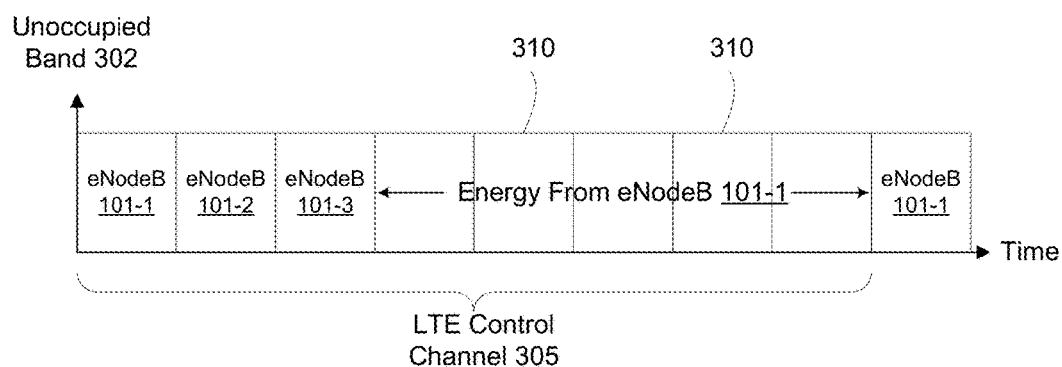

When another eNodeB 101 detects the LTE control channel 305, it negotiates with the eNodeB 101-1 to occupy another of the sub channels 310. In this regard, eNodeB 101-1 decreases the amount of time that the other RF energy is transmitted in the LTE channel 305 to vacate one of the sub channels 310 for the next eNodeB 101. This is illustrated in FIGS. 5 and 6 where the eNodeB 101-2 occupies the sub channel 310 next in the eNodeB 101-1 once the eNodeB 101-1 vacates that sub channel 310. Then, another eNodeB 101-3 may detect the LTE control channel 305 and occupy the sub channel 310 next to the sub channel 310 of the eNodeB 101-2, and so on. Generally, this sub channel 310 fill process continues for each of the eNodeBs 101 needing to transmit control information until all of the sub channels 310 of the LTE control channel 305 are filled. Once the LTE control channel 305 is filled, the eNodeB 101-1 or another eNodeB 101 may establish another LTE control channel 305 at another unoccupied portion of the RF band.

In one embodiment, the energy from the eNodeB 101-1 used to reserve the LTE control channel 305 in the unoccupied portion of the RF band (e.g., until the sub channels 310 are filled by other eNodeBs 101) can be used to communicate other data. For example, a preamble or some predefined sequence known to the other eNodeBs 101 in the LTE communication network 105 can be used to quickly identify the LTE control channel 305 of the eNodeB 101-1 and indicate which of the sub channels 310 are available for occupation by the other eNodeBs 101.

Other examples of information that can be transmitted include GPS location information, channel frequency information, and the like which can be used by the LTE network processing element 110 to negotiate sub channel 310 allocation for other eNodeBs 101. For example, if the eNodeB 101-2 connects to the UE 102, it communicates the GPS information of the UE 102 and the frequency of the channel in which the communications between the eNodeB 101-2 and the UE 102 are occurring to the LTE network processing element 110. The LTE network processing element 110 then directs the eNodeB 101-2 to the control channel 305 established by the eNodeB 101-2 such that the eNodeB 101-2 can transmit its control information that may be used to handoff the call to other eNodeBs 101 in the LTE control channel 305.

Figure 7:
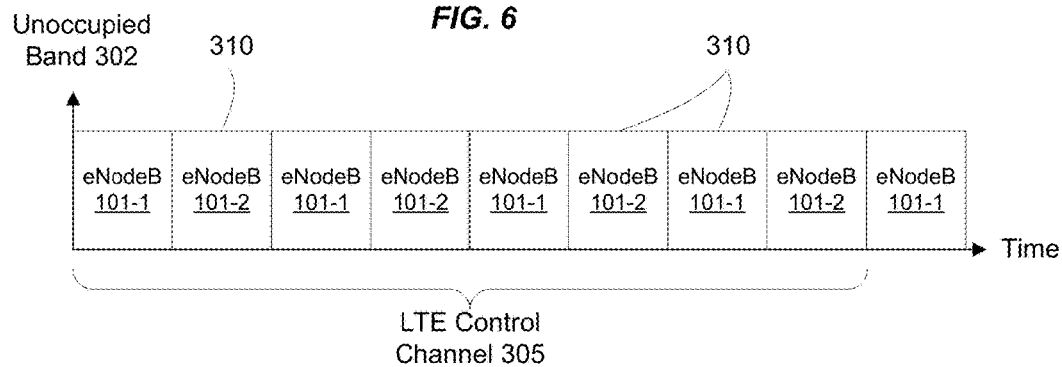

In another embodiment, the eNodeB 101-1, upon establishing the LTE control channel 305, may time division multiplex with other eNodeBs 101 entering into the control channel 305. For example, in FIG. 7, once the eNodeB 101-1 establishes the LTE control channel 305, it may occupy the entire duration of the LTE control channel 305 with its control information. Then, as another eNodeB 101-2 needs to transmit its control information in the LTE control channel 305, the eNodeB 101-2 may negotiate with the LTE network processing element 110 to enter into the LTE control channel 305. In this regard, the LTE network processing element 110 may direct the eNodeBs 101-1 and 101-2 to fully occupy the duration of the LTE control channel 305 via time multiplexed sub channels 310, thereby ensuring that all of the LTE control channel 305 is occupied in preventing other wireless systems from sensing/determining otherwise.

Figure 8:
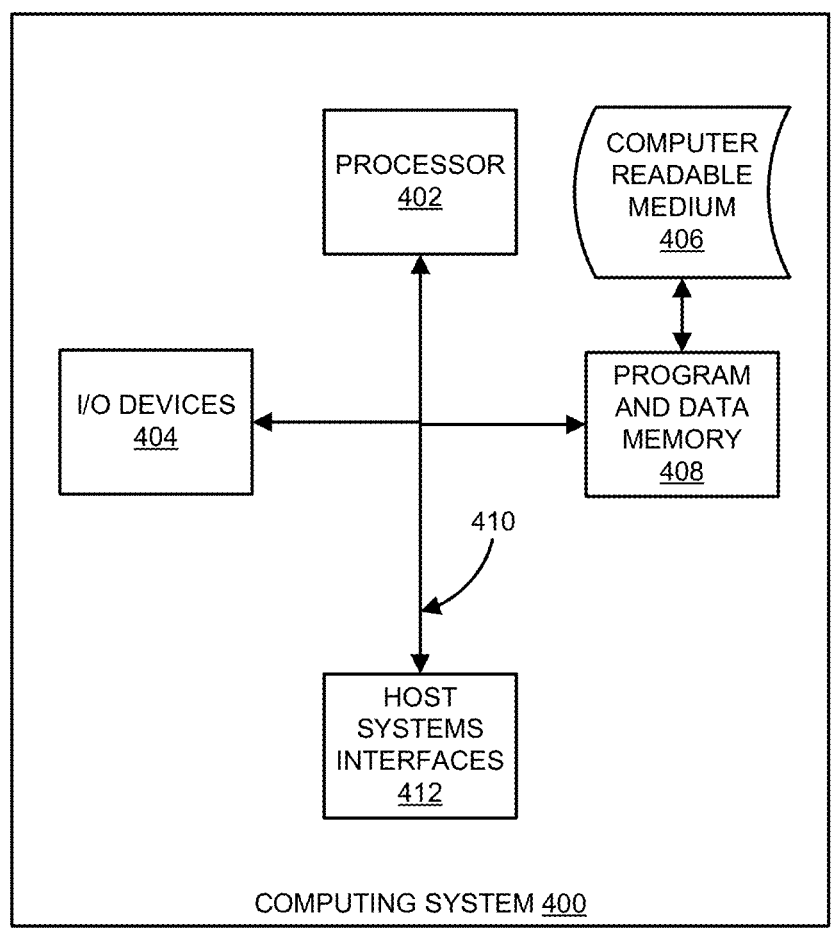
FIG. 8 is a block diagram of an exemplary computing system in which a computer readable medium provides instructions for performing methods herein.

The invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 8 illustrates a computing system 400 in which a computer readable medium 406 may provide instructions for performing any of the methods disclosed herein.

Furthermore, the invention can take the form of a computer program product accessible from the computer readable medium 406 providing program code for use by or in connection with a computer or any instruction execution system. For the purposes of this description, the computer readable medium 406 can be any apparatus that can tangibly store the program for use by or in connection with the instruction execution system, apparatus, or device, including the computer system 400.

The medium 406 can be any tangible electronic, magnetic, optical, electromagnetic, infrared, or semiconductor system (or apparatus or device). Examples of a computer readable medium 406 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 400, suitable for storing and/or executing program code, can include one or more processors 402 coupled directly or indirectly to memory 408 through a system bus 410. The memory 408 can include local memory employed during actual execution of the program code, bulk storage, and cache memories which provide temporary storage of at least some program code in order to reduce the number of times code is retrieved from bulk storage during execution. Input/output or I/O devices 404 (including but not limited to keyboards, displays, pointing devices, etc.) can be coupled to the system either directly or through intervening I/O controllers. Network adapters may also be coupled to the system to enable the computing system 400 to become coupled to other data processing systems, such as through host systems interfaces 412, or remote printers or storage devices through intervening private or public networks. Modems, cable modem and Ethernet cards are just a few of the currently available types of network adapters.

What is claimed is:

1. A Long Term Evolution (LTE) wireless communication system operating in a Radio Frequency (RF) band with a conflicting wireless system, the LTE system comprising:
a first eNodeB operable to transmit downlink communications to user equipment (UE) in the RF band, to receive uplink communications from the UE in the RF band, to transmit an LTE control channel across a portion of the RF band, to time divide the LTE control channel into a plurality of subchannels, and to occupy a first of the subchannels; and
a second eNodeB operable to transmit downlink communications to the UE in the RF band, to receive uplink communications from the UE in the RF band, to detect the LTE control channel, and to occupy a second of the subchannels proximate in time to the first subchannel of the first eNodeB,
wherein the first eNodeB is further operable to fill the entire LTE control channel with random data to occupy the entire LTE control channel until the second eNodeB occupies the second subchannel.

2. The LTE wireless communication system of claim 1, wherein:
the first eNodeB and the second eNodeB are further operable to time multiplex the first and second subchannels within the LTE control channel.

3. The LTE wireless communication system of claim 1, wherein:
the first eNodeB is further operable to search the RF band, and to determine that said portion of the RF band is operable to support the LTE control channel.

4. A method operable with a Long Term Evolution (LTE) wireless communication system operating in a Radio Frequency (RF) band with a conflicting wireless system, the method comprising:
transmitting an LTE control channel across a portion of the RF band from a first eNodeB;
time-dividing the LTE control channel into a plurality of subchannels via the first eNodeB;
occupying a first of the subchannels with control information of the first eNodeB;
detecting the LTE control channel with a second eNodeB;
occupying, via the second eNodeB, a second of the subchannels proximate in time to the first subchannel of the first eNodeB; and
filling the entire LTE control channel with random data to occupy the entire LTE control channel until the second eNodeB occupies the second subchannel.

5. The method of claim 4, further comprising:
time-multiplexing the first and second subchannels within the LTE control channel via the first and second eNodeB.

6. The method of claim 4, further comprising:
searching the RF band, via the first eNodeB; and
determining that said portion of the RF band is operable to support the LTE control channel.

7. A non-transitory computer readable medium comprising instructions that, when executed by one or more processors operable within a Long Term Evolution (LTE) wireless communication system operating in a Radio Frequency (RF) band with a conflicting wireless system, direct the processors to:
transmit an LTE control channel across a portion of the RF band from a first eNodeB;
time-divide the LTE control channel into a plurality of subchannels via the first eNodeB;
occupy a first of the subchannels with control information of the first eNodeB;
detect the LTE control channel with a second eNodeB;
occupy, via the second eNodeB, a second of the subchannels proximate in time to the first subchannel of the first eNodeB; and
fill the entire LTE control channel with random data to occupy the entire LTE control channel until the second eNodeB occupies the second subchannel.

8. The computer readable medium of claim 7, further comprising instructions that direct the one or more processors to:
time-multiplex the first and second subchannels within the LTE control channel via the first and second eNodeB.

9. The computer readable medium of claim 7, further comprising instructions that direct the one or more processors to:
search the RF band, via the first eNodeB; and
determine that said portion of the RF band is operable to support the LTE control channel.

* * * * *